United States Patent [19]

Dowling et al.

[11] Patent Number: 4,894,604
[45] Date of Patent: Jan. 16, 1990

[54] FLUID CAPACITANCE SENSING MEANS AND METHOD

[75] Inventors: Donald J. Dowling; Jackie C. Sims, both of Houston, Tex.

[73] Assignee: Texaco Inc., White Plains, N.Y.

[21] Appl. No.: 269,341

[22] Filed: Nov. 3, 1988

[51] Int. Cl.[4] ............................................. G01R 27/26
[52] U.S. Cl. .................................... 324/690; 340/620; 324/448
[58] Field of Search .................. 340/606, 603, 620; 73/304 C, 863.41; 324/71.4, 448, 449, 61 P, 60 R

[56] References Cited

U.S. PATENT DOCUMENTS

| | | | |
|---|---|---|---|
| 2,913,893 | 11/1959 | Mathews | 324/448 |
| 3,916,300 | 10/1975 | Chisdes | 324/448 |
| 4,044,607 | 8/1977 | Deal | 324/61 P |
| 4,068,162 | 1/1978 | Robinson | 324/448 |
| 4,392,110 | 7/1983 | Elmenshawy | 324/448 |
| 4,728,882 | 3/1988 | Stanbro | 324/61 P |
| 4,782,282 | 11/1988 | Bachman | 324/71.4 |

FOREIGN PATENT DOCUMENTS 160355   1/1964   U.S.S.R. .......................... 324/61 P

Primary Examiner—Reinhard J. Eisenzopf
Assistant Examiner—Jose M. Solis
Attorney, Agent, or Firm—Robert A. Kulason; James J. O'Loughlin; Ronald G. Gillespie

[57] ABSTRACT

A fluid capacitance sensor includes a device, receiving a stream of fluid, which converts the fluid flow to annular fluid flow. A capacitance sensing network has an internal capacitance substantially greater than the capacitance of the fluid. The capacitance sensing network measures the capacitance of the annular flowing fluid and provides a signal corresponding to the sensed capacitance of the fluid.

7 Claims, 2 Drawing Sheets

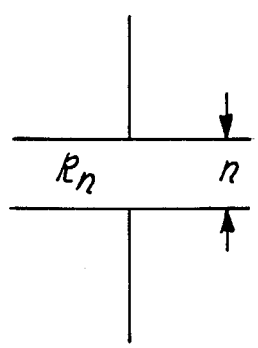
FIG. 1
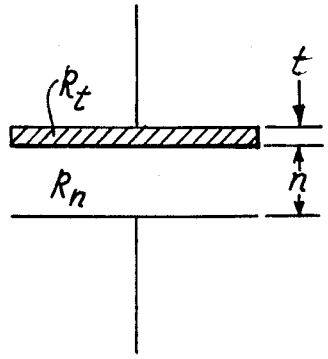
FIG. 2
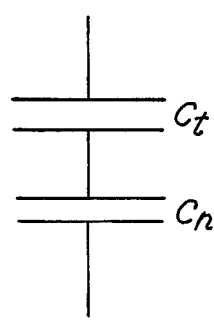
FIG. 3
FIG. 4
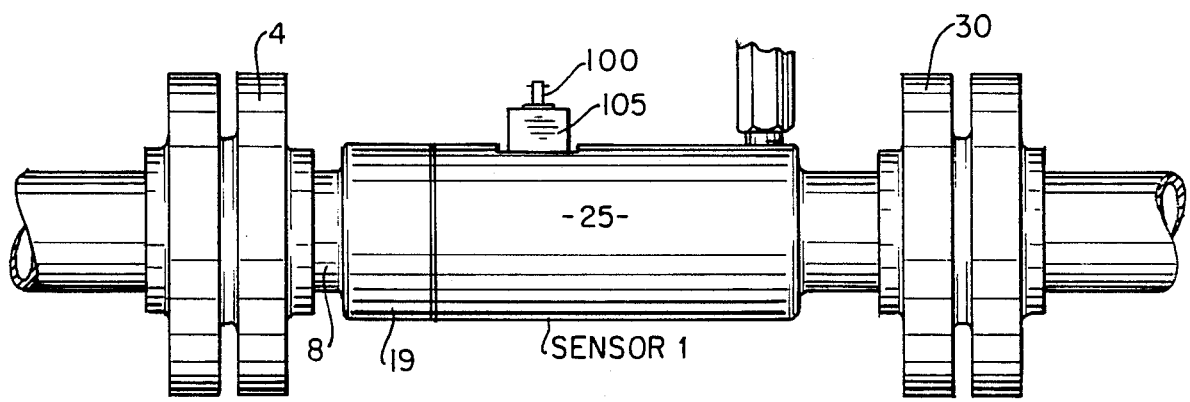
FIG. 6
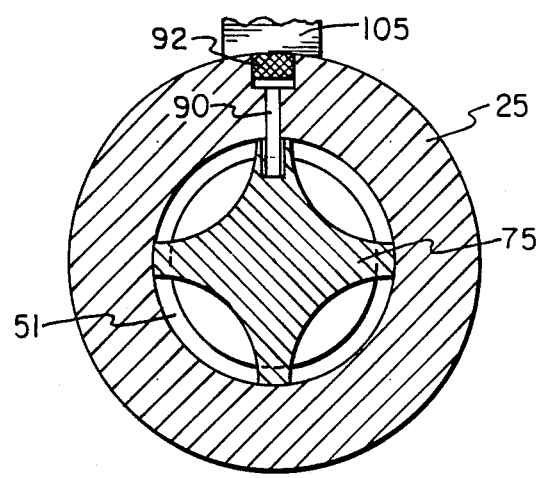

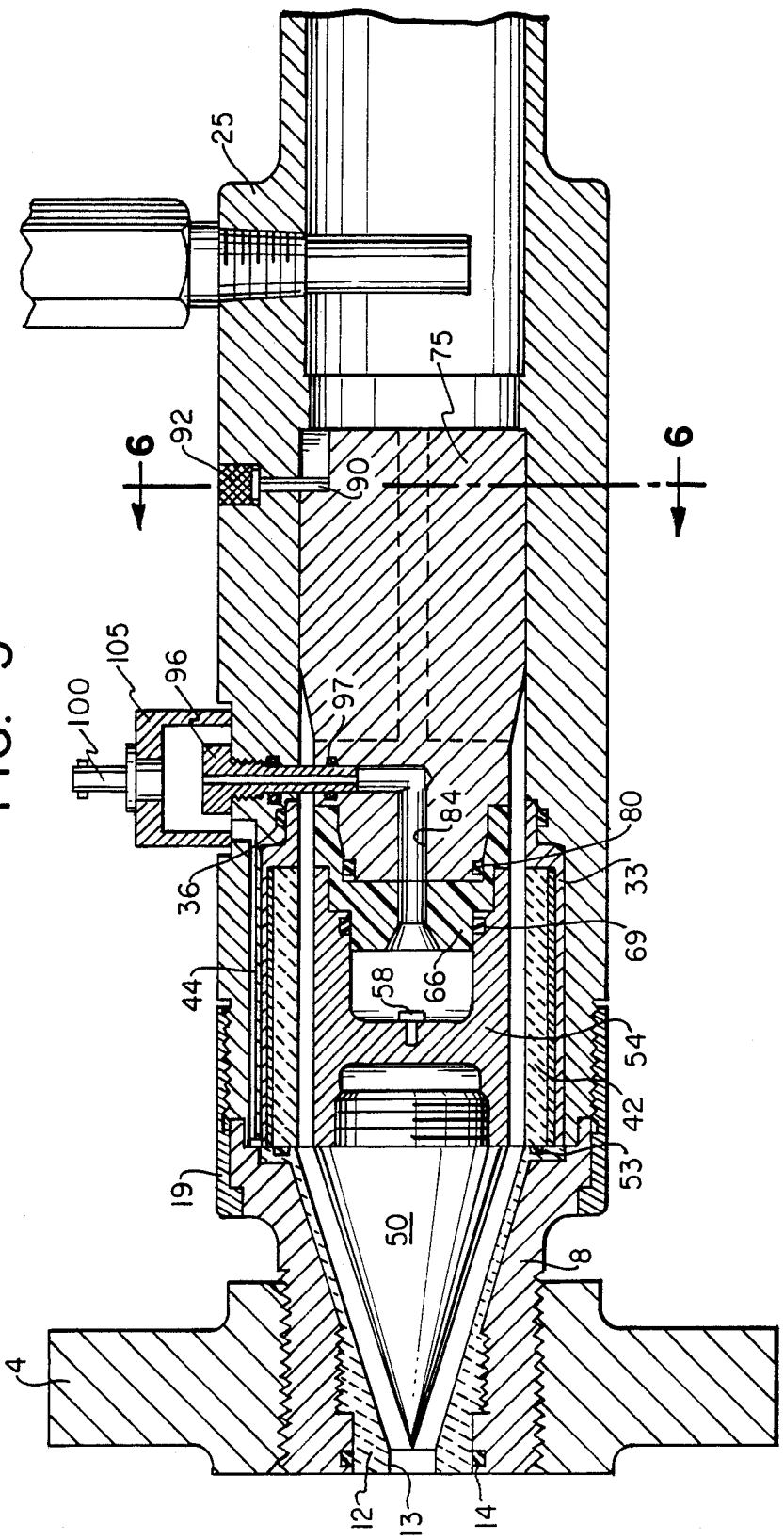

FLUID CAPACITANCE SENSING MEANS AND METHOD

BACKGROUND OF THE INVENTION

Field of the Invention

The present invention relates to apparatus and method for monitoring a fluid stream and more particularly to monitoring the capacitance of the flowing fluid.

SUMMARY OF THE INVENTION

A fluid capacitance sensor includes a device, receiving a stream of fluid, which converts the fluid flow to annular fluid flow. A capacitance sensing network has an internal capacitance substantially greater than the capacitance of the fluid. The capacitance sensing network measures the capacitance of the annular flowing fluid and provides a signal corresponding to the sensed capacitance of the fluid.

The objects and advantages of the invention will appear more fully hereinafter from a consideration of the detailed description which follows, taken together with the accompanying drawings, wherein one embodiment of the invention is illustrated by way of example. It is to be expressly understood, however, that the drawings are for illustration purposes only and are not to be construed as defining the limits of the invention.

DESCRIPTION OF THE DRAWINGS

FIG. 1 is a schematic representation of a prior art capacitor.

FIG. 2 is a schematic representation of a capacitance sensor constructed in accordance with the present invention.

FIG. 3 is an equivalent circuit of the capacitance sensor.

FIG. 4 depicts the capacitance sensor connected inline in a pipeline.

FIG. 5 is an assembly drawing of a capacitance sensor constructed in accordance with the present invention.

FIG. 6 is a cross-sectional view of the capacitance sensor along the line 6—6 in FIG. 5.

DESCRIPTION OF THE INVENTION

In certain industrial fluid flow monitoring operations an electronic measuring apparatus is often used which employs a sensor consisting of two or more electrodes. The sensor design frequently requires the presence of the electrodes in the flow stream where they are subject to erosion from physical bombardment by solid particles entrained in the flow. This is particularly so in high velocity flow streams.

In addition the chemical characteristics of the flowing fluid (or fluids, in the case of multi-phase flow) may likewise cause or aggravate electrode erosion. The chemical characteristics of the fluids may also cause interference in the electrical measurement derived from the sensor electrode signals.

When these conditions exist in a pipeline, electrodes coated with electrical insulation are often used to cope with the problems described. In many cases this remedy is adequate, and satisfactory operation of the measuring apparatus is achieved.

As more and more industrial operations are being included in automatic control loops, monitoring sensors are being applied in streams where the flow conditions exceed the electrical and physical limits of the sensors commonly employed.

For example, "dirtier" streams of fluids with more solids and streams having solids with greater mass are becoming candidates for fluid flow measurement. Higher temperatures are being encountered by the sensors. The combination of greater contaminant concentration with its attendant erosion effects and increased temperatures to 400 deg. and 500 deg. F. exclude a large number of electrode insulating materials presently available.

Another significant problem encountered under these difficult flow conditions using insulated electrodes is one of an electrical nature. Typically, insulated electrodes are used in an electrical capacitance sensing arrangement. The stream of fluids, whose electrical characteristics are to be sensed, is directed between pairs of electrodes. The effect on the capacitance of the electrode-pair is measured and related to the desired characteristics of the stream of fluids by mathematical means. It is essential to the ultimate fluids characterization that the determination of the capacitance effect be sensed and measured accurately.

The difficulty in achieving the necessary accuracy can be seen by reference to the accompanying figures and mathematical expressions.

FIG. 1 is a standard schematic representation of a parallel plate capacitor and also represents a simplified version of a two-electrode capacitance sensor. It should be noted that the electrode configuration is not limited only to parallel-plate but also includes coaxial or other geometries.

The capacitance of the parallel-plate arrangement, $C_n$, in FIG. 1 where $k_n$ is the relative dielectric constant of the space between the plates and n is the distance between the plates is given as:

$$C_n = (Ak_n m)/n \qquad (1)$$

where A is the area of the plates and m is a multiplying constant used to equate dimensions and adjust the resulting calculation to convenient engineering units.

FIG. 2 is like FIG. 1 in every respect except that one plate of the capacitor has been moved slightly apart and coated with an insulating layer of relative dielectric constant, $k_t$. The distance, n, in FIG. 2 is equal to n in FIG. 1. Considering the capacitance of the insulation region:

$$C_t = (Ak_t m)/t \qquad (2)$$

where A and m are as before and t is the insulation thickness. The ratio of $C_t$ and $C_n$ can be written:

$$C_t/C_n = (Ak_t m/t)/(Ak_n m/n)$$

and $$C_t/C_1 = (k_t/k_n)(n/t) \qquad (3)$$

for purposes of illustration the following typical values of n and t can be assigned:

n = 0.125 ins.

t = 0.01 ins.

To illustrate the electrical problem, two extreme but physically realistic values of the ratio $k_t/k_n$ will be analyzed.

CASE 1, $k_t/k_n=1$

Here $k_t$ and $k_n$ could both have a dielectric constant of 2.

Referring to FIG. 3 the effect of the insulation on one electrode can be modeled as two separate capacitors electrically connected in series. The resultant total capacitance, $C_T$, of the two can be obtained from $$1/C_t = 1/C_n + 1/C_t$$

which can be rearranged to $$C_T = (C_n C_t)/(C_n + C_t) \quad (4)$$

Substituting in equation 3 the values for n, t and $k_t/k_n$ we have $$C_t/C_n = (n)(0.125)/(0.01)$$

$$C_t/C_n = 12.5$$

or $$C_t = 12.5 C_n \quad (5)$$

Considering, in this case that, $C_t$ is substantially greater than $C_n$, equation 4 becomes $$C_t \approx C_n \quad (6)$$

In this case, then, the effective capacitance of the sensor is more sensitive to the region between the plates where the stream of fluids flows.

CASE 2, $k_t/k_n = 0.025$

Here $k_t$ would still be 2, but $k_n$ because of the nature of the flow stream could realistically rise to 80.

Substituting this ratio of $k_t/k_n$ in equation 3 along with previous values of n and t yields:

$$C_t/C_n = (0.025)(0.125)/(0.01)$$

$$C_t/C_n = 0.3125, \; C_n = C_t/0.3125$$

or $$C_n = 3.2 C_t \quad (7)$$

Since $C_n$ is significantly larger than $C_t$, equation 4 now reduces essentially to:

$$C_T \approx C_t \quad (8)$$

It can be seen from 8, that the effective capacitance of the sensor now is due mainly to the insulation on the electrode. The capacitance from the region where the fluid stream passes contributes very little.

From these two illustrations, it has been shown that for an increasing net dielectric constant of a stream of fluids passing within the sensing region of an insulated electrode capacitance sensor, the sensor frequently responds less to the fluids and more to the capacitance of the insulation. This sensor characteristic is untenable in many important stream monitoring applications, especially where the temperature effects on the insulation are uncertain.

Further analysis of the two cases indicates that if the capacitance associated with the electrode insulation could be raised by an order of magnitude or more, the fluid sensing region would dominate the capacitance measurement. Equation 2 suggests that reducing the thickness t, would provide an improvement. A reduction of the insulation thickness below 0.010 ins, however, creates a high risk of damage to the insulation from the flow stream, resulting in exposure of the bare electrode to the stream.

Further study of equation 2 reveals that a substantial increase in the dielectric constant, $k_t$, would accomplish the desired effect. Values of $k_t$ in the range of hundreds would be required, however.

Materials having all of the physical characteristics to meet the mechanical and thermal environmental conditions described, and yet have dielectric constant values in the hundreds, if they exist at all, would be difficult and expensive to implement as an electrode insulation.

The present invention uses a method and device which meets all of the physical and mechanical demands listed and yet has dielectric constant values reaching into the thousands.

With reference to FIG. 4, there is shown a coaxial capacitance sensor 1 connected inline with a pipeline 2 carrying a fluid. A section of pipeline 2, immediately prior to sensor 1, in terms of fluid flow direction, has a constrictor (not shown).

With reference to FIGS. 4 and 5, sensor 1 includes a flange 4 for connecting to pipeline 6 and is affixed to an inlet head 8 having inside of it an inlet head liner 12. Inlet head 8 is made of stainless steel, while inlet head liner 12 may be made of an insulator material such as Fluorosint made by the Polymer Corp. Inlet head 8 has an inlet 13 and also has a groove in it for accepting an O ring 14 which maintains a seal between inlet head 8 and inlet head liner 12.

A threaded coupling 19 is affixed to inlet head 8 so that it may be coupled to other elements of sensor 1 as hereinafter explained.

A stainless steel shell 25 containing threads which may be coupled by threading to coupling 19. Affixed to shell 25 is another flange 30. As can be seen, shell 25 has fair size center opening which accommodates other elements as hereinafter explained.

Also affixed to shell 25 on an interior chamber is a shell liner 33. Shell 25 has a groove cut in it for an O ring 36 to provide sealing between the shell 25 and shell liner 33. A ceramic sensing element 42 having a brass sleeve 44 is located internal of shell liner 33. The ceramic of element 42 is made from lead/zirconate/titanate. However, it may also be barium titanate or any other ceramic from a family of electrostrictive materials. The shell 25, shell liner 33, sensing element 42 and sleeve 44 comprise a sub-assembly having a hollow center in which there is located a deflector cone 50 affixed to an electrode 54. Cone 50 protrudes beyond the aforementioned sub-assembly so that when the sub-assembly is coupled to coupling 19, cone 50 enters into a cavity of head liner 12. Cone 50 deflects the fluid entering inlet 13. Further O ring 53 provides sealing between head liner 12 and sensing element 42.

Electrode 54 is made of a conductive material such as brass and has a terminal screw 58 threaded into it.

As can be seen, the outer dimension of the deflection cone 50 and electrode 54 is such that there is a passageway for the fluid to flow between electrode 54 and sensing element 42.

An insulator 66 is affixed to electrode 54 to facilitate its mounting within shell 25. The interface between electrode 54 and insulator 66 is sealed with an O ring 69. Insulator 66 is affixed to an electrode support 75 with its interface sealed by an O ring 80. Further there is a passageway 84 through insulator 66 and electrode support 75. It should be noted that although from FIG. 5 it would look like there is no passageway between electrode support 75 and shell 25, the cross-sectional shape of electrode support 25 is shown in FIG. 6 which does depict passage ways.

A locator pin 90 locks electrode support 75 in place and thus keeps cone 50, electrode 54, insulator 66 and electrode support 75 from turning in sensor 1. A welded plug 92 prevents locator pin 90 from popping out.

A bolt 96 and O rings is threaded into shell 25. O rings 97 provide sealing between bolt 96 and shell 25 and between bolt 96 and electrode support 75. Part of the bolt enters the passageway 84 so that a wire connected to terminal 58 may be fed through the passageway 84 through the center of the bolt to be connected to a connector 100 mounted on a metal mount 105 affixed to shell 25.

What is claimed is:

1. A capactive fluid sensor comprising:
   means receiving a stream of fluid for converting the fluid flow to annular fluid flow; and
   capactive sensing means for providing a capacitance signal related to the dielectric constant of the annular flowing fluid, said capacitive sensing means includes:
   a cylindrical electrode,
   electrode means, cylindrical in shape, spatially arranged with the electrode so that the fluid flows between both the electrode and the electrode means for providing an internal capacitance for the capacitive sensing means substantially greater than a capacitance derived from the dielectric constant of the fluid, and
   output means connected to the electrode and to the electrode means for providing the capacitance signal.

2. A sensor as described in claim 1 in which the electrode means includes:
   an electrode, and
   material affixed to the electrode having a predetermined dielectric constant.

3. A sensor as described in claim 2 in which the dielectric constant of the material is substantially greater than the dielectric constant of the fluid.

4. A sensor as described in claim 3 in which the material is ceramic of a family of electrostrictive materials.

5. A sensor as described in claim 4 in which the material has a dielectric constant equal to or greater than 1,000.

6. A sensor as described in claim 5 in which the dielectric constant of the material is 1.725.

7. A sensor as described in claim 4 in which the material is a mixture of lead/zirconate/titanate.

* * * * *